United States Patent [19]

Dawson

[11] 3,749,985

[45] July 31, 1973

[54] HIGH FREQUENCY INSULATED GATE FIELD EFFECT TRANSISTOR FOR WIDE FREQUENCY BAND OPERATION

[75] Inventor: Robert Herman Dawson, Ithaca, N.Y.

[73] Assignee: RCA Corporation, New York, N.Y.

[22] Filed: Apr. 10, 1972

[21] Appl. No.: 242,390

[52] U.S. Cl. ..... 317/235 R, 317/235 B, 317/235 G, 307/304, 317/234 N

[51] Int. Cl. .......... H01l 11/14

[58] Field of Search .......... 317/235 G, 235 B; 307/304

[56] References Cited

UNITED STATES PATENTS

| | | | |
|---|---|---|---|
| 3,073,428 | 6/1972 | Athanas | 307/202 |
| 3,541,543 | 11/1970 | Crawford | 340/324 |
| 3,652,906 | 3/1972 | Christensen | 317/235 |
| 3,657,614 | 4/1972 | Cricchi | 317/235 R |
| 3,590,342 | 6/1971 | Jekot | 317/235 |
| 3,575,609 | 4/1971 | Izumi | 307/221 |
| 3,653,978 | 4/1972 | Robinson | 148/1.5 |
| 3,465,293 | 9/1969 | Weckler | 340/166 |

*Primary Examiner*—Martin H. Edlow
*Attorney*—Glenn H. Bruestle and Robert P. Williams

[57] ABSTRACT

An insulated gate field effect transistor adapted for use at high frequencies, with usable gain within a broad range of frequencies, includes a plurality of dual gate MOS transistor unit structures, each with good characteristics for high frequency operation, interconnected in parallel on a single semiconductor body. The parallel combination provides a relatively high ratio of transconductance to output load capacitance and the gain bandwidth product of the device is therefore relatively high. The unit structures are formed in a substrate region including a ground plane. The means for interconnecting the unit structures in parallel includes a diffused region for connecting one gate electrode of each unit to the corresponding gate electrode of the others. This diffused region lies close to each unit structure to provide a local capacitive high frequency by-pass to ground. Low capacitance beam leads for connecting the device to external circuitry further reduce output loading capacitances.

10 Claims, 5 Drawing Figures

HIGH FREQUENCY INSULATED GATE FIELD EFFECT TRANSISTOR FOR WIDE FREQUENCY BAND OPERATION

This invention was made under a contract with the Department of the Army and/or a contract with the Department of the Air Force.

BACKGROUND OF THE INVENTION

This invention relates to insulated gate field effect transistors adapted for operation at high (e.g., UHF) frequencies.

Insulated gate field effect transistor structures, notably MOS dual gate devices, are capable of operation with relatively good gain performance at frequencies as high as two gigahertz. Devices are known which have exhibited power gains of about 18 to 20 dB with noise figures from 3 to 3.5 dB at 1 gigahertz. The gain-bandwidth product characterizing these prior devices is such, however, that when they are operated at usefully high gain levels, the bandwidth has been narrow, i.e., less than about 30 megahertz. The devices referred to here have been described in the Monthly Contract Reports submitted under the Army Contract referred to above, which was with the Army Electronics Command at Ft. Monmouth, N.J., Contract DAA B07-68-C-0252. The broad concepts of minimizing parasitic loading capacitance and paralleling small optimized devices to improve bandwidth are expressed in some of these reports. See for example the second Monthly Report ECOM-0252-2, Feb., 1969, at page 2 and the final report ECOM-0252-F, October, 1971. How these broad concepts may be effectively put into practice is not disclosed, however.

Other structures for field effect transistors useful at high frequencies are known. See, for example, Carlson et al., U.S. Pat. No. 3,315,096; Olmstead et al., U.S. Pat. No. 3,427,514; and Van Iersel, U.S. Pat. No. 3,482,152. Each of these structures has some feature or features optimized to obtain good high frequency performance. For example, in Carlson et al, the transistor is built in an epitaxial layer on a high conductivity substrate, in order to reduce the drain-to-source loading resistance. In Olmstead et al., dual gate devices are described which exhibit low drain-diode capacitance. In Van Iersel, a shielding layer is provided under a drain bonding pad to reduce the effect of drain capacitances.

THE DRAWINGS

THE PREFERRED EMBODIMENT

Figure 1:
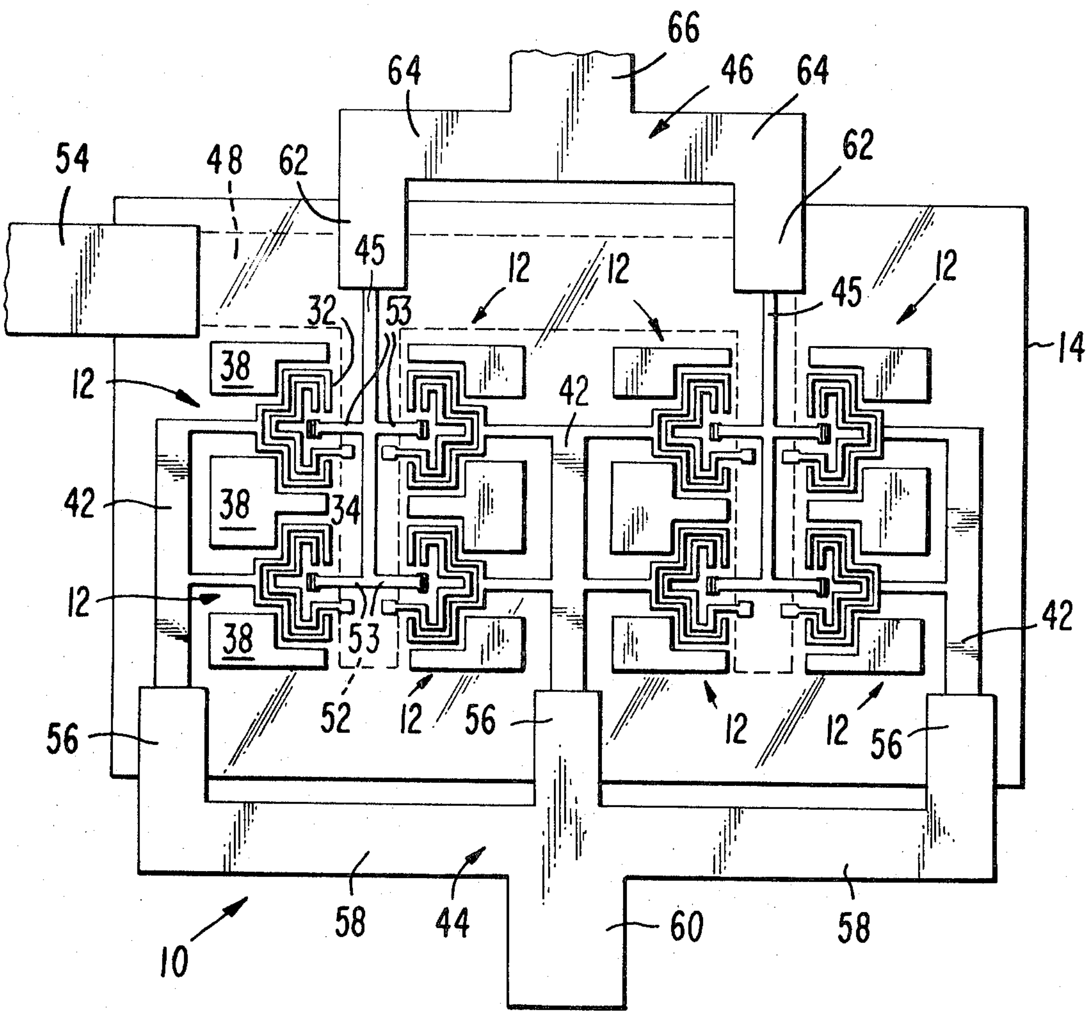
FIG. 1 is a plan view of one embodiment of the present novel device.

An insulated gate field effect transistor 10 which is made up of a plurality of dual gate MOS unit structures 12 is shown in FIG. 1. As will be described further below, each of the unit structures 12 has features which enable it to operate, as an amplifier for example, at relatively high maximum frequency. The bandwidth over which one of these unit structures will operate with useful gain is relatively limited, however.

A known figure of merit for an amplifying device, applicable to vacuum tubes, bipolar transistors, and insulated gate field effect transistors, is gain-bandwidth product which is directly proportional to the transconductance of the device and inversely proportional to the output loading capacitance. A good derivation of this relationship appears in Corcoran and Price, "Electronics," John Wiley and Sons, New YOrk, 1954, at pages 292 to 294. In the prior structures described in the Government Contract Reports identified above, two unit structures were paralleled to achieve relatively high transconductance without a proportionate increase in capacitance. However, only two unit structures were used because the complexity of each unit structure produced a problem in connecting the four terminals thereof in parallel on one semiconductor chip.

In the present novel device, a plurality of unit structures which may be more than two may be paralleled in such a manner as to increase the overall transconductance of the device substantially without proportionally increasing the output capacitance, thereby increasing the gain-bandwidth product. When operated at the same gain levels as were the prior devices, the present device, therefore, exhibits a bandwidth which is higher by an amount substantially proportional to the increase in transconductance. As shown in FIG. 1, there are eight of the unit structures 12 although there may be more or less of these structures depending on the transconductance of each unit structure 12 and the overall transconductance which is desired for the device 10.

The device 10 includes a substrate 14 of semiconductive material, usually silicon, which is made up of a body 16 of one type conductivity, P+ type in this example, which has a relatively high degree of conductivity. The body 14 further includes an epitaxial layer 18 disposed on the body 16. The epitaxial layer has the same type conductivity but a lower degree of conductivity than the body 16. The size of the body 14 is not critical and will be determined largely by the numer of unit structures 12 which is chosen. In one example of the present device incorporating eight unit structures as shown, the body 14 may be about 20 mils by about 26 mils in area. The doping concentrations in the body 16 and the epitaxial layer 18 and the thicknesses of these elements are also not critical and are matters within the skill of the art. The body 16 may have a resistivity, for example, between 0.01 and 0.05 ohm cm. and the epitaxial layer 18 may have a resistivity of about 10 ohm cms. The thickness of the body 16 may be about 2 mils and the thickness of the epitaxial layer may be about 0.3 mil, for example.

A coating of insulating material 20 is disposed on the epitaxial layer 18 and serves to protect the various PN junctions of the device, as well as to provide an insulated support for deposited metallic leads in the manner known in the semiconductor art. The insulating layer 20 has openings 22 at predetermined locations therein to enable contact to be made to the material of the epitaxial layer 18.

Figure 3:
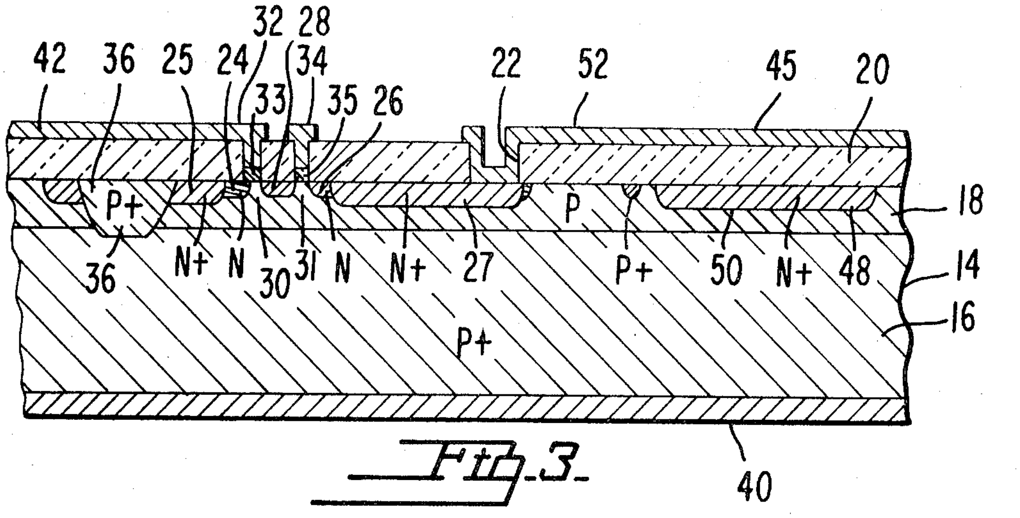
FIG. 3 is a cross section taken on the line 3—3 of FIG. 2.
Figure 2:
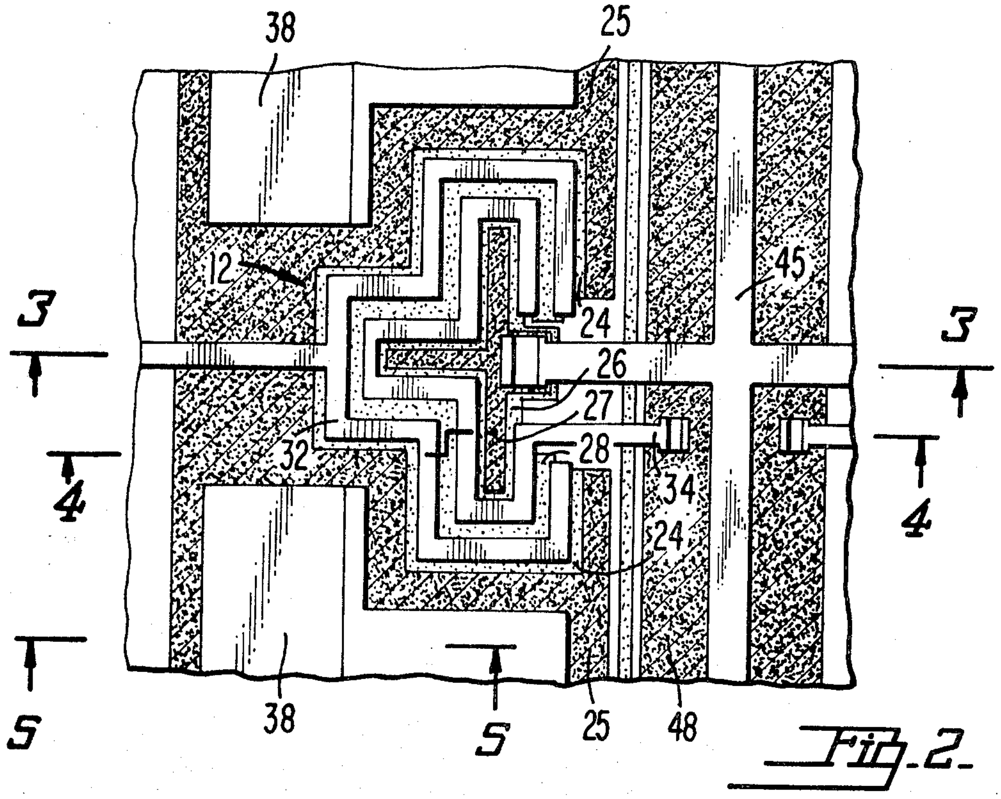
FIG. 2 is an enlarged view of a portion of the structure shown in FIG. 1 showing the details of one dual gate unit structure thereof.

Each unit structure 12 has a structure which is substantially equivalent to the semi-closed structure shown in FIG. 3 of Olmstead et al., identified above. The topography of the elements in the present device is different and is such as to provide a relatively large channel width, for relatively high transconductance, while not making the drain diode area unduly large. A typical unit structure is shown in detail in FIG. 2 in plan view and in FIGS. 3, 4, and 5 in cross section. Each unit structure includes a source region 24 of N type conductivity, a source contact region 25 of N+ type conductivity, a drain region 26 of N type conductivity and a drain contact region 27 of N+ type conductivity, all formed by diffusion of conductivity modifiers in known manner into the epitaxial layer 18. The structure 12 also includes an intermediate source-drain region 28 which divides the space between the source and drain regions 24 and 26 into a first channel region 30 and a second channel region 31. A first insulated gate 32, which may be a deposited conductor, overlies the first channel region 30 and is insulated therefrom by means of a relatively thin insulator 33. Similarly, a second insulated gate 34 overlies the second channel region 31 and is insulated therefrom by a thin insulator 35. These elements of the unit structure may be made by the process described in Dawson et al., U.S. Pat. No. 3,455,020.

The device 10 includes means for interconnecting the unit structures 12 in parallel so that the transconductances of the unit structures are, in effect, added. The several source contact regions 25 are connected to the body 16 by elements shown in FIGS. 3 and 5. In particular, there is adjacent to each source region 25 a P+ type diffused region 36 which extends entirely through the epitaxial layer 18 into contact with the body 16. Metal layers 38 (FIGS. 1, 2 and 5) are disposed on the surface of the epitaxial layer in shorting relationship to the source contact regions 25 and the P+ type region 36 so that the source contact regions 25 are effectively connected to the body 16. A metal layer on the back surface of the body 16 provides for connecting the several sources to external circuitry.

The several first gates 32 of the unit structures 12 are interconnected by deposited conductors 42 disposed on the insulating coating 20. The conductors 42 extend from each first gate 32 to a location near the periphery of the substrate 14 where a novel beam lead 44, described more particularly below, connects the conductors 42 to each other and is adapted to connect them to external circuitry.

The several drain contact regions 27 are interconnected by deposited metal conductors 45, similarly disposed on the insulating coating 20 and extending to locations adjacent to the periphery of the substrate 14. A beam lead 46 similar to the beam lead 44 is connected to the conductors 45.

Figure 4:
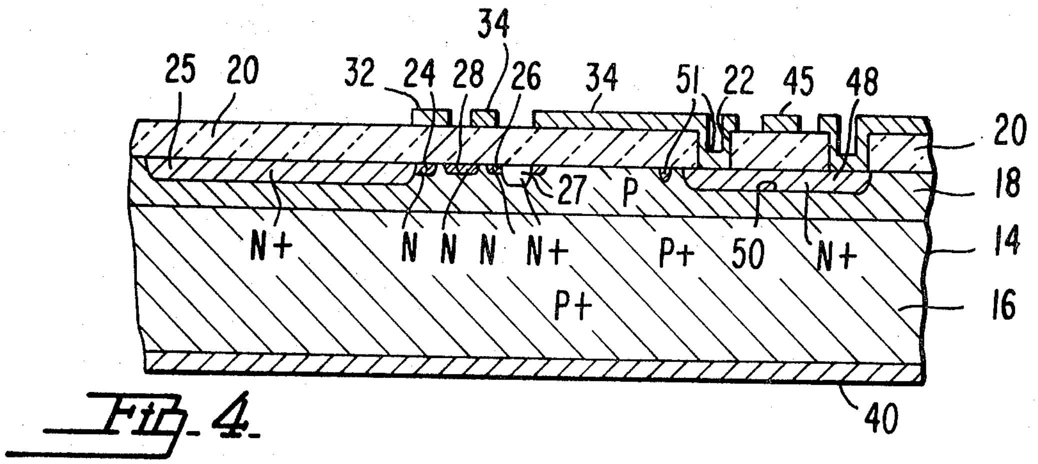
FIG. 4 is a cross section taken on the line 4—4 of FIG. 2.
Figure 5:
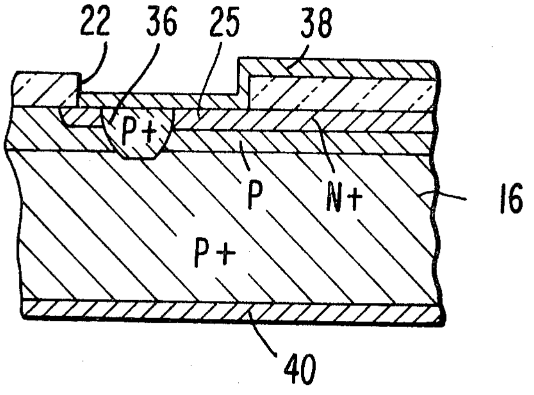
FIG. 5 is a cross section taken on the line 5—5 of FIG. 2.

The second gates 34 of the unit structures 12 are interconnected by a diffused region 48 within the epitaxial layer 18 and defining a PN junction 50 (FIGS. 3 and 4) therewith. As shown in FIG. 4, the second gates each have a terminal portion 51 which extends through an opening 22 in the insulating coating 20 to contact an elongated portion 52 (FIG. 1) of the diffused region 48.

As shown in FIG. 1, the unit structures 12 are disposed in two groups of four and in each group the unit structures are symetrically disposed on either side of and are closely adjacent to the elongated portion 52 of the diffused region 48. Also as shown in FIG. 1, the drain connecting conductor 45 is elongated in the same direction as the portion 52 of the diffused region 48 and overlies this portion. The drain connecting conductor also has transversely extending portions 53 which contact the several drain contact regions 27 through openings 22 in the insulating coating 20, as best seen in FIG. 3. Almost all of the area of the drain connecting conductors 45 overlies the diffused region 48. The diffused region 48 also extends to a location near the periphery of the substrate 14 where it is contacted by a beam lead 54.

The interconnection of the respective second gates 34 by means of the diffused region 48 simplifies the otherwise complicated problem of interconnecting the unit structures 12. The diffused region 48 also serves to provide a capacitance in series between the overlying drain connecting conductors 45 and the material of the epitaxial layer 18 so as to shield the drain connecting conductors 45 in a manner similar to the shielding region in the Van Iersel patent identified above. For this purpose, the PN junction 50 should have as large an area as possible. The region 48 and the PN junction 50 also provide a capacitive shunt to ground for high frequency signals which are coupled to the second gates 34. Because of the proximity of the region 48 to each unit structure 12, the resistance along the region 48 does not adversely affect the high frequency performance of the device.

The beam leads 44 and 46 are made by conventional processes but have a novel configuration, as illustrated in FIG. 1. The beam lead 44, for example, has portions 56 thereof which engage the first gate connecting conductors 42 and which are cantilevered off the edge of the substrate 14.

The cantilevered portions 56 are interconnected by joining portions 58, which are spaced from the edge of the substrate 14 as shown. A tab 60 provides for connection of the beam leads 44 to an external conductor such as a strip-line. The beam lead 46 is similarly constructed. It includes cantilevered portions 62 which are joined by portions 64 spaced from the edge of the substrate 14. The beam lead 46 also has a connecting tab 66. In both the beam leads 44 and 46 the spacing of the joining portions from the edge of the substrate provides for a relatively low capacitance between these beam leads and the substrate 14.

The device 10 may be operated in the same circuits in which the prior devices described in the above-identified Government Contract Reports were used. In general, the device may be used as an amplifier in the common source mode in which the conductor 40 is connected to ground. The beam lead 54 is then connected to a DC source so as to provide a DC bias potential to the respective second gates 34. The beam lead 44 is the input lead of the device and this lead is connected to the high frequency signal to be amplified. A working voltage is applied to the beam lead 46 and the output also is taken from this beam lead.

Assuming that the unit structures 12 in the present novel device are identical to the unit structures of the devices described in the Government Contract Reports, the device 10 will exhibit a transconductance which is about four times that of the prior structure. The drain diode capacitance of the device 10 will likewise be about four times greater than the prior device but the capacitance due to the interconnection conductors 45 and the beam lead 46 will not be substantially greater than the capacitance due to the similar elements, i.e., the conductors connecting the drains to external circuitry, in the prior device. Consequently, in the present device the ratio of transconductance to output loading capacitance will be substantially greater than in the prior device. As such, the present device will exhibit a larger gain-bandwidth product thus adapting it for operation at similar gain levels across a wider frequency band.

What is claimed is:

1. An insulated gate field effect transistor adapted for operation at high frequencies comprising a substrate of semiconductive material of one type conductivity, means in and on said substrate for defining a plurality of dual insulated gate field effect transistor unit structures, each unit structure comprising a source region, a first channel region, an intermediate source-drain region, a second channel region, a drain region, a first insulated gate adjacent to said first channel region, and a second insulated gate adjacent to said second channel region, and means interconnecting the respective source regions, drain regions and first and second gates of said unit structures in parallel, said means including at least one diffused conductor region of conductivity type opposite to that of said substrate, in said substrate and defining a PN junction therewith, said diffused conductor region extending from a location near the periphery of said substrate to points closely adjacent to each unit structure, the second gates of each unit structure being connected to said diffused conductor region.

2. An insulated gate field effect transistor as defined in claim 1 wherein said substrate comprises a body of semiconductive material of said one type conductivity but of relatively high degree of conductivity and an epitaxial layer of said one type conductivity but of relatively lower degree of conductivity on said body, said PN junction being within said layer, said epitaxial layer having a coating of insulating material thereon, said coating having openings at predetermined locations therein to enable contact to be made to said epitaxial layer, and wherein said interconnecting means further includes conductive means connecting each source region to said body of semiconductive material, at least one deposited conductor on said insulating coating interconnecting the first gates of each unit structure and extending to a location at the periphery of said substrate, and at least one other deposited conductor on said insulating coating extending through openings therein to interconnect said drain regions and also extending to a location at the periphery of said substrate.

3. An insulated gate field effect transistor as defined in claim 2 wherein said conductive means connecting the sources to the body comprises a diffused region of said one type conductivity adjacent to each unit structure and extending through said epitaxial layer to said body, and means ohmically connecting each source region to said diffused region.

4. An insulated gate field effect transistor as defined in claim 2 wherein substantially all of said drain connecting conductor overlies said diffused conductor region.

5. An insulated gate field effect transistor as defined in claim 4 wherein said PN junction defined by said diffused conductor region has a predetermined area whereby it exhibits a predetermined range of capacitances determined by the voltages applied to said second gates when said transistor is operated in a circuit.

6. An insulated gate field effect transistor as defined in claim 2 wherein at least a portion of said diffused conductor region has the configuration of an elongated strip, the unit structures adjacent to said strip lying symetrically on opposite sides thereof.

7. An insulated gate field effect transistor as defined in claim 6 wherein said drain connecting conductor has an elongated portion extending in generally parallel relation to and lying centrally over said portion of said diffused conductor region, said drain connecting conductor further having portions extending normally to said elongated portion thereof to terminations in contact with said drain regions.

8. An insulated gate field effect transistor as defined in claim 1 further comprising an electrode connected to said body for coupling said source regions to external circuitry, and cantilevered beam leads at the periphery of said substrate, one connected to each of said first gate connecting and drain connecting conductors and said diffused conductor region for connecting said first gates, said drains, and said second gates, respectively, to external circuitry.

9. An insulated gate field effect transistor as defined in claim 8 wherein there are a plurality of said first gate connecting conductors each terminating at the periphery of said substrate, the beam lead connected thereto having a plurality of cantilevered portions, one portion contacting each of said plurality of first gate connecting conductors, and having a joining portion interconnecting said cantilevered portions, said joining portion being spaced away from the periphery of said substrate.

10. An insulated gate field effect transistor as defined in claim 9 wherein there are a plurality of said drain connecting conductors each terminating at the periphery of said substrate, the beam lead connected thereto having a plurality of cantilevered portions, one portion contacting each of said plurality of drain connecting conductors, and having a joining portion interconnecting said cantilevered portions, said joining portion being spaced away from the periphery of said substrate.

* * * * *